United States Patent
Kim et al.

(10) Patent No.: US 9,202,973 B2
(45) Date of Patent: Dec. 1, 2015

(54) LIGHT EMITTING DIODE

(71) Applicant: Seoul Viosys Co., Ltd., Ansan-si (KR)

(72) Inventors: Jong Kyu Kim, Ansan-si (KR); So Ra Lee, Ansan-si (KR); Ho Jun Suk, Ansan-si (KR); Jin Cheol Shin, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 49 days.

(21) Appl. No.: 14/099,423

(22) Filed: Dec. 6, 2013

(65) Prior Publication Data

US 2014/0091338 A1    Apr. 3, 2014

Related U.S. Application Data

(63) Continuation of application No. 13/187,010, filed on Jul. 20, 2011, now Pat. No. 8,629,471.

(30) Foreign Application Priority Data

Jul. 22, 2010 (KR) .......... 10-2010-0070840
Oct. 28, 2010 (KR) .......... 10-2010-0106172

(51) Int. Cl.
*H01L 29/18* (2006.01)
*H01L 33/00* (2010.01)
*H01L 33/08* (2010.01)
(Continued)

(52) U.S. Cl.
CPC .............. *H01L 33/08* (2013.01); *H01L 27/156* (2013.01); *H01L 33/58* (2013.01); *H01L 33/145* (2013.01); *H01L 33/20* (2013.01); *H01L 33/38* (2013.01);
(Continued)

(58) Field of Classification Search
None
See application file for complete search history.

(56) References Cited

U.S. PATENT DOCUMENTS 5,893,562 A    4/1999  Spector
6,504,180 B1   1/2003  Heremans et al.
(Continued)

FOREIGN PATENT DOCUMENTS

JP    09-097922    4/1997
JP    10-107316    4/1998
(Continued)

OTHER PUBLICATIONS

Chul Huh et al., "Improvement in light-output efficiency of InGaN/GaN multiple-quantum well light-emitting diodes by current blocking layer", Journal of Applied Physics, vol. 92, No. 5, pp. 2248-2250 Sep. 1, 2002.

(Continued)

*Primary Examiner* — Mark Tornow
*Assistant Examiner* — Priya Rampersaud
(74) *Attorney, Agent, or Firm* — H.C. Park & Associates, PLC

(57) ABSTRACT

Exemplary embodiments of the present invention relate to light emitting diodes including a plurality of light emitting cells on a substrate to be suitable for AC driving. The light emitting diode includes a substrate and a plurality of light emitting cell formed on the substrate. Each light emitting cell includes a first region at a boundary of the light emitting cell and a second region opposite to the first region. A first electrode pad is formed in the first region of the light emitting cell. A second electrode pad having a linear shape is disposed to face the first electrode pad while regionally defining a peripheral region together with the boundary of the second region. A wire connects the first electrode pad to the second electrode pad between two adjacent light emitting cells.

18 Claims, 17 Drawing Sheets

(51) Int. Cl.
    *H01L 27/15*    (2006.01)
    *H01L 33/58*    (2010.01)
    *H01L 33/14*    (2010.01)
    *H01L 33/20*    (2010.01)
    *H01L 33/38*    (2010.01)
    *H01L 33/62*    (2010.01)

(52) U.S. Cl.
    CPC ......... *H01L 33/62* (2013.01); *H01L 2924/0002* (2013.01)

(56) References Cited

U.S. PATENT DOCUMENTS

| | | | |
|---|---|---|---|
| 6,630,689 B2 | 10/2003 | Bhat et al. | |
| 6,847,052 B2 | 1/2005 | Fan et al. | |
| 7,417,259 B2 | 8/2008 | Sakai et al. | |
| 7,531,841 B2 | 5/2009 | Ko et al. | |
| 7,700,960 B2 * | 4/2010 | Kim | H01L 33/42 257/72 |
| 7,768,020 B2 | 8/2010 | Kim et al. | |
| 8,309,971 B2 | 11/2012 | Seo et al. | |
| 2003/0071271 A1 * | 4/2003 | Suzuki | H01L 27/14601 257/98 |
| 2008/0111141 A1 * | 5/2008 | Li | H01L 33/54 257/88 |
| 2008/0117519 A1 * | 5/2008 | Chari | B29C 33/3842 359/619 |
| 2008/0218098 A1 | 9/2008 | Lee et al. | |
| 2009/0159909 A1 * | 6/2009 | Lee | H01L 33/38 257/96 |
| 2010/0078658 A1 | 4/2010 | Lee et al. | |
| 2010/0097300 A1 | 4/2010 | Yim | |
| 2010/0295014 A1 * | 11/2010 | Kang | H01L 33/22 257/13 |
| 2011/0012139 A1 | 1/2011 | Yamamoto | |
| 2011/0089447 A1 * | 4/2011 | Kuo | H01L 33/44 257/98 |
| 2011/0300650 A1 * | 12/2011 | Chen | H01L 33/44 438/27 |
| 2012/0074836 A1 * | 3/2012 | Piquette | H01L 33/44 313/501 |

FOREIGN PATENT DOCUMENTS

| | | |
|---|---|---|
| JP | 2007-096117 | 4/2007 |
| JP | 2007-287849 | 11/2007 |
| JP | 2008-135554 | 6/2008 |
| JP | 2009-259805 | 11/2009 |
| KR | 1020000057921 | 9/2000 |
| KR | 100640496 | 10/2006 |
| KR | 1020070064208 | 6/2007 |
| KR | 1020080085401 | 9/2008 |
| KR | 1020090049055 | 5/2009 |
| KR | 1020090066863 | 6/2009 |
| WO | 2004-023568 | 3/2004 |
| WO | 2010/024375 | 3/2010 |

OTHER PUBLICATIONS

International Search Report dated Mar. 2, 2012 for PCT/KR2011/005372.

Non-Final Office Action issued in U.S. Appl. No. 13/187,010 dated Nov. 9, 2012.

Final Office Action issued in U.S. Appl. No. 13/187,010 dated May 23, 2013.

Notice of Allowance issued in U.S. Appl. No. 13/187,010 dated Sep. 16, 2013.

Office Action issued on Apr. 1, 2015, in Chinese Patent Application 201180035911.2.

* cited by examiner

Prior Art

Fig. 17
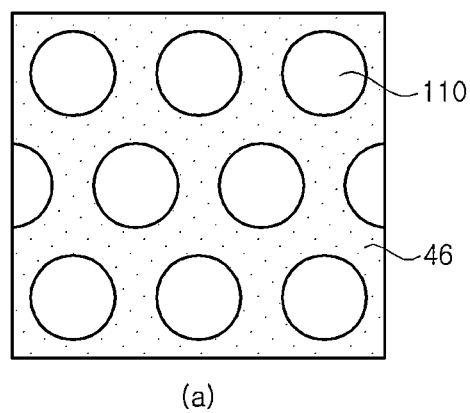
(a)
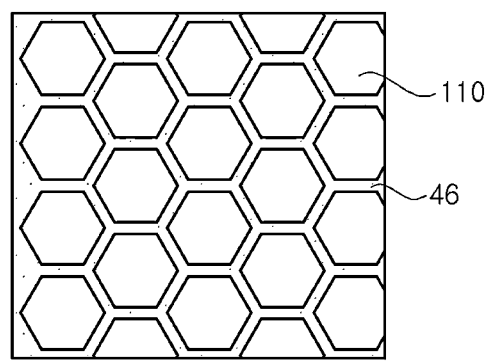
(b)
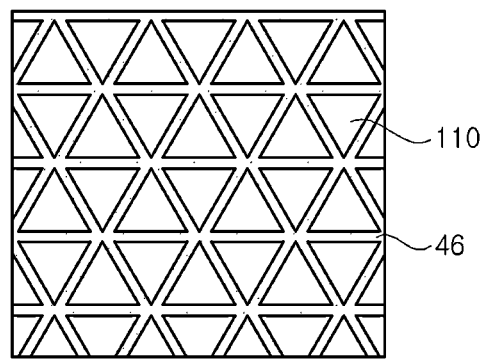
(c)

LIGHT EMITTING DIODE

CROSS REFERENCE TO RELATED APPLICATION

This application is a continuation of U.S. patent application Ser. No. 13/187,010, filed on Jul. 20, 2011, and claims priority from and the benefit of Korean Patent Application No. 10-2010-0070840, filed on Jul. 22, 2010 and Korean Patent Application No. 10-2010-0106172, filed on Oct. 28, 2010, all of which are hereby incorporated by reference for all purposes as if fully set forth herein.

BACKGROUND OF THE INVENTION

1. Field of the Invention

Exemplary embodiments of the present invention relate to light emitting diodes including compound semiconductors and to light emitting diodes suitable for AC operation.

2. Discussion of the Background

Light emitting diodes (LEDs) can be made of compound semiconductors including, for example, Group III nitride-based compound semiconductors which have been used in a wide range of applications including display devices and backlight units and also as light sources for general lighting as a replacement to existing incandescent lamps and fluorescent lamps.

Generally, an LED is repeatedly turned on/off depending on the direction of electric current applied by an AC power source. Thus, when the LED is directly connected to the AC power source, the LED does not continuously emit light and is liable to be damaged by the reverse current. To solve such problems of the LED, International Publication No. WO 2004/023568 (A1), entitled "Light-emitting device having light-emitting elements" by Sakai et al. proposes an LED that is directly connected to a high voltage AC power source.

FIG. 1 illustrates a conventional AC light emitting diode 1. Referring to FIG. 1, the AC light emitting diode 1 includes a plurality of rectangular light emitting cells 4, which are formed on an insulation substrate 2. Further, bonding pads 3a, 3b are formed on the substrate 2.

The conventional light emitting diode 1 includes an n-type electrode pad 6 and a p-type electrode pad 8 on each of the light emitting cells 4. The light emitting cell 4 is partially removed to a predetermined depth to expose part of a middle layer in the light emitting cell 4. The exposed layer is typically an n-type semiconductor layer, and the n-type electrode pad 6 is formed on a region of the exposed n-type semiconductor layer. The p-type electrode pad 8 is formed on a p-side region at the top of the light emitting cell 4. The bonding pads 3a, 3b and the light emitting cells 4 between the bonding pads 3a, 3b are connected to one another in series by wires 5. The p-type electrode pad 8 and the n-type electrode pad 6 of adjacent light emitting cells are connected to each other by the wire 5.

In such a conventional light emitting diode 1, if the distance between the n-type electrode pad 6 and the p-type electrode pad 8 is large in a corresponding light emitting cell 4, electric current is concentrated mostly near the p-type electrode pad 8 so that light is strongly emitted near the p-type electrode pad 8. Further, when p-type electrode pad 8 is located near the n-type electrode pad 6, brightness increases in a region between the p-type electrode pad 8 and the n-type electrode pad 6, but significantly decreases in a region between the p-type electrode pad 8 and a boundary of the light emitting cell 4. This results in significant deterioration in luminous uniformity of the light emitting diode and becomes a major hindrance in manufacture of large scale light emitting diodes.

In other types of conventional light emitting diodes, an n-type electrode pad and a p-type electrode pad may be diagonally disposed to face each other at opposite corners of a light emitting cell. However, in these types of light emitting diodes, brightness is high only near the p-type electrode pad 8, thereby causing non-uniform light emitting.

SUMMARY OF THE INVENTION

Exemplary embodiments of the invention provide a light emitting diode which has improved current spreading characteristics between electrode pads of light emitting cells having different polarities to provide uniform light emitting.

Additional features of the invention will be set forth in the description which follows, and in part will be apparent from the description, or may be learned by practice of the invention.

Exemplary embodiments of the present invention disclose a light emitting diode including a substrate, a plurality of light emitting cells, a first electrode pad, a second electrode pad, and a wire. The plurality of light emitting cells is disposed on the substrate. Each light emitting cell includes a first region at a boundary of the light emitting cell and a second region opposite to the first region. The first electrode pad is disposed at the first region. The second electrode pad has a linear shape and is disposed to face the first electrode pad. The second electrode pad defines a peripheral region together with a boundary of the second region. The wire connects the first electrode pad of a first light emitting cell to the second electrode pad of a second light emitting cell.

Exemplary embodiments of the present invention disclose a light emitting diode including a light emitting cell, a first electrode pad, and a second electrode pad. The first electrode pad is disposed at the first region. The second electrode pad has a linear shape and is disposed to face the first electrode pad. The second electron pad defines a peripheral region together with a boundary of the second region.

Exemplary embodiments of the present invention disclose a light emitting diode including a substrate, a plurality of light emitting cells, a wire layer, an insulation layer, and micro-lenses. The plurality of light emitting cells is separated from each other on the substrate. Each light emitting cell includes a lower semiconductor layer, an active layer disposed on at least a portion of the lower semiconductor layer, an upper semiconductor layer, and a transparent electrode layer. The wire layer electrically connects lower semiconductor layers of a first light emitting cell to upper semiconductor layers of a second light emitting cell adjacent to the first light emitting cell. The insulation layer is disposed between the wire layer and the plurality of light emitting cells to prevent short circuit in the plurality of light emitting cells due to the wire layer. The micro-lenses are formed on the plurality of light emitting cells.

Exemplary embodiments of the present invention disclose a light emitting diode including a substrate, a plurality of light emitting cells, a wire layer, and an insulation layer. The plurality of light emitting cells is separated from each other on the substrate. Each light emitting cell includes a lower semiconductor layer, an active layer disposed on at least a portion of the lower semiconductor layer, an upper semiconductor layer, and a transparent electrode layer. The wire layer electrically connects lower semiconductor layers of a first light emitting cell to upper semiconductor layers of a second light emitting cell adjacent to the first light emitting cell. The insulation layer is disposed between the wire layer and the plurality of light emitting cells to prevent short circuit in the plurality of light emitting cells due to the wire layer. Each of the light emitting cells includes a current shield under the wire layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

FIG. 17 shows plan views of various micro-lenses according to exemplary embodiments of the present invention.

DETAILED DESCRIPTION OF THE ILLUSTRATED EMBODIMENTS

Figure 1:
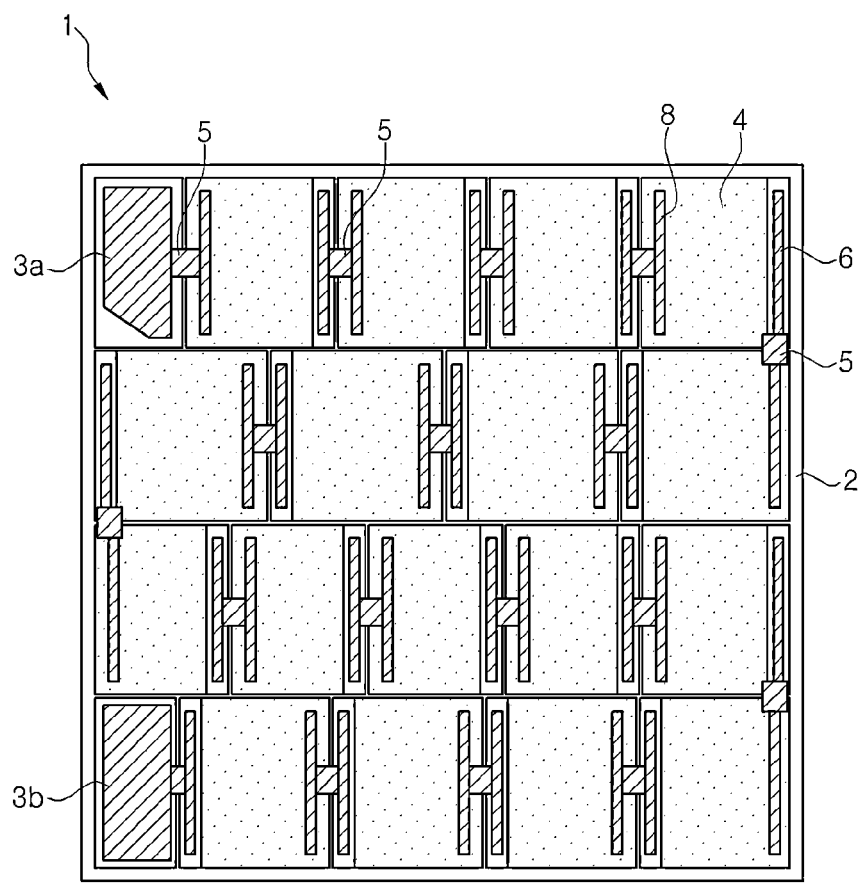
FIG. 1 is a plan view of a conventional light emitting diode including a plurality of light emitting cells according to exemplary embodiments of the invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough and will fully convey the scope of the invention to those skilled in the art. In the drawings, the sizes and relative sizes of layers and regions may be exaggerated for clarity. Like reference numerals in the drawings denote like elements. Detailed descriptions of well-known functions and descriptions incorporated herein may be omitted to avoid obscuring the subject matter of the present invention.

It will be understood that when an element such as a layer, film, region or substrate is referred to as being "on", "connected to", or "coupled to" another element or layer, it can be directly on the other element or layer or intervening elements may also be present. In contrast, when an element is referred to as being "directly on", "directly connected to", or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing exemplary embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present invention are described in detail with reference to the accompanying drawings.

Figure 2:
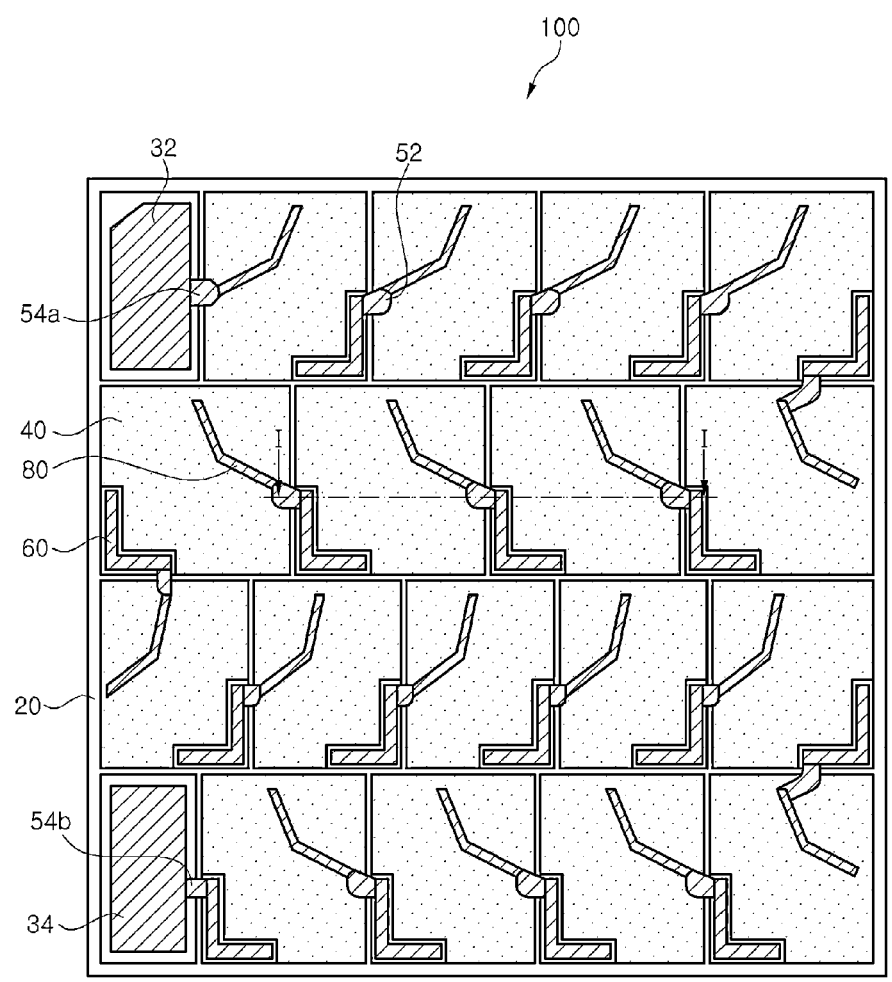
FIG. 2 is a plan view of a light emitting diode according to exemplary embodiments of the invention.

FIG. 2 is a plan view of a light emitting diode 100 according to exemplary embodiments of the invention.

Referring to FIG. 2, the light emitting diode 100 may include a substrate 20 and a plurality of light emitting cells 40. The light emitting diode may include a first electrode pad 60 (hereinafter, referred to as an "n-type electrode pad") and a second electrode pad 80 (hereinafter, referred to as a "p-type electrode pad") on each of the light emitting cells 40. The light emitting diode 100 may include a first bonding pad 32 and a second bonding pad 34 formed on the substrate 20.

The plurality of light emitting cells 40 may be formed on a single substrate 20 and connected in series to each other via wires 52 to form an array. Each of the wires 52 may connect the n-type electrode pad 60 of one light emitting cell 40 to the p-type electrode pad 80 of another light emitting cell adjacent to the n-type electrode pad 60. The first bonding pad 32 is connected in series to the p-type electrode pad 80 of a light emitting cell at one end of the array via a wire 54a, and the second bonding pad 34 is connected in series to the n-type electrode pad 60 of another light emitting cell at another end of the array via a wire 54b.

The wires 52, the n-type electrode pad 60, and the p-type electrode pad 80 may be parts of a wire layer formed by a step cover process. Namely, the wires 52, the n-type electrode pad 60, and the p-type electrode pad 80 may be formed simultaneously and may be included in a single wire layer, in which corresponding parts of the wire layer are divided into the wires 52, the n-type electrode pad 60, and the p-type electrode pad 80 according to the positions and functions describe above.

Arrays of the light emitting cells 40 may be connected in reverse parallel to each other between the bonding pads 32, 34 to be driven by an AC power source.

In some cases, the wires 52 may be formed by a step cover process that includes forming an insulation layer to cover the substrate 20 and the light emitting cells 40, forming openings in the insulation layer to expose the electrode pads 60, 80, and forming a conductive material layer in a line shape on the insulation layer such that the conductive material layer connects electrode pads of adjacent light emitting cells to each other.

The conductive material layer may substantially act as the wires 52 which may connect the light emitting cells to each other. The conductive material layer may be made of any suitable conductive material.

The substrate 20 may be an insulation substrate which can electrically insulate the light emitting cells 40 from each other. A sapphire substrate may be used as a growth substrate for growing nitride semiconductor layers for the light emitting cells 40. Each of the light emitting cells 40 may be configured to have the same area or different areas. Each of the light emitting cells 40 may include an n-type semiconductor layer, an active layer, and a p-type semiconductor layer, which are sequentially formed on the substrate 20. Each of the light emitting cells 40 may further include a transparent electrode layer, such as an indium tin oxide (ITO) layer, on the p-type semiconductor layer. However, the n-type semiconductor layer may be formed at an upper portion of the light emitting cell 40 and the p-type semiconductor layer may be formed a lower portion, with reference to the active layer, of the light emitting cell 40.

Figure 3:
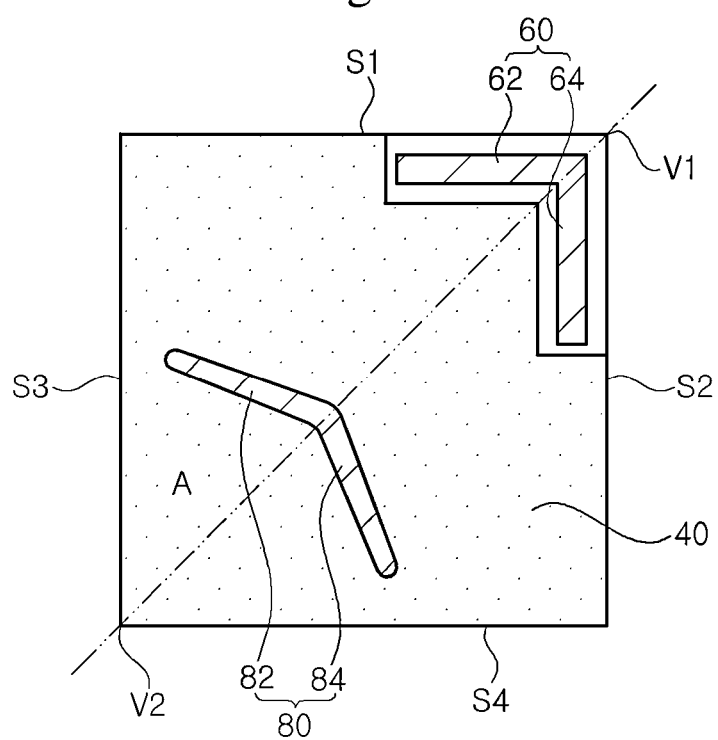
FIG. 3 is an enlarged plan view of a light emitting cell of the light emitting diode shown in FIG. 2 according to exemplary embodiments of the invention.

FIG. 3 is an enlarged plan view of a light emitting cell 40 of the light emitting diode shown in FIG. 2. Referring to FIG. 3, the light emitting cell 40 may include a substantially square boundary and may be formed with the n-type electrode pad 60 at one corner along a boundary of the light emitting cell 40. The n-type electrode pad 60 may include two linear portions 62, 64, which are parallel to two sides S1, S2 of the one corner of the light emitting cell 40, and meet each other at a right angle (i.e., 90 degrees) near a vertex V1 of the one corner. The one corner of the light emitting cell 40 may correspond to a region of the light emitting cell on which the p-type semiconductor layer and the active layer are removed to expose the n-type semiconductor layer.

The p-type electrode pad 80 may be formed such that a central region of the p-type electrode pad 80 is at a determined distance from an opposite corner that is opposite to the one corner of the light emitting cell 40, and both ends of the p-type electrode pad 80 may be adjacent to the boundary of the light emitting cell 40. The p-type electrode pad 80 may surround a peripheral region A of the opposite corner together with boundaries of the opposite corner, that is, two sides S3, S4 of the light emitting cell 40. The p-type electrode pad 80 may include two linear portions 82 and 84, which may extend from both ends of the p-type electrode pad 80 adjacent to the two sides S3, S4 towards the n-type electrode pad 60 and may meet each other at the middle of the p-type electrode pad 80. With such a configuration, the distance between the p-type electrode pad 80 and the n-type electrode pad 60 can be sufficiently reduced without significantly increasing the area of a region behind the p-type electrode pad 80, that is, the area of the peripheral region A of the opposite corner. This configuration substantially prevents non-uniform light emission induced by current crowding near the p-type electrode pad 80.

The peripheral region A may be divided into two regions by an imaginary diagonal line (indicated by a dash-dot dotted line in FIG. 3) connecting vertices V1, V2 at both corners of the light emitting cell 40. Since these two regions are adjacent to both ends of the p-type electrode pad 80, reduction in brightness may not be severe. An angle defined between the two linear portions 82, 84 of the p-type electrode pad 80 may be greater than 90 degrees.

The shapes of the light emitting cell 40 and the electrode pads 60, 80 in plan view, and arrangement of the electrode pads 60, 80 on the light emitting cell may be modified in various ways without departing from the scope and sprit of the invention. For example, the shape of the light emitting cells 40 is not limited to a square or rectangle, and other shapes, such as circular, parallelogram, or trapezoidal shapes may be used. Furthermore, it should be understood that n-type electrode pad 60 and p-type electrode pad 80 may be made of one or more suitable electrode materials. FIG. 4, FIG. 5, FIG. 6, FIG. 7, FIG. 8, FIG. 9, FIG. 10, and FIG. 11 show various shapes and arrangement of the light emitting cell 40 and the electrode pads 60, 80 according to exemplary embodiments of the invention.

Figure 4:
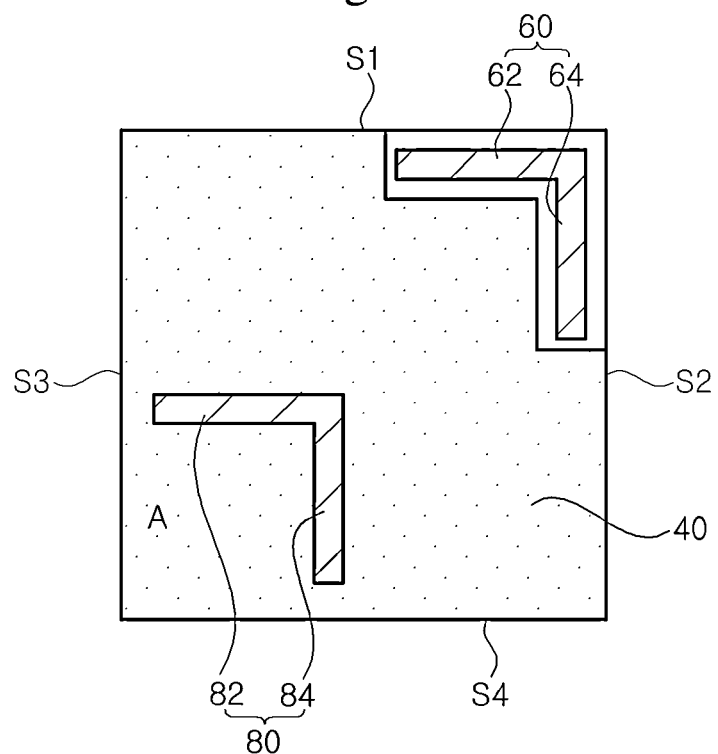
FIG. 4, FIG. 5, FIG. 6, FIG. 7, FIG. 8, FIG. 9, and FIG. 10 are plan views of light emitting cells according to exemplary embodiments of the invention.

In FIG. 4, an n-type electrode pad 60 and a p-type electrode pad 80 may be arranged on a substantially square (or rectangular) light emitting cell 40 as shown in FIG. 3. However, an angle defined between two linear portions 82, 84 of the p-type electrode pad 80 may be the same as the angle defined between two linear portions 62, 64 of the n-type electrode pad 60. For example, the angle between the two linear portions 82, 84 of the p-type electrode pad 80 may be 90 degrees.

Figure 5:
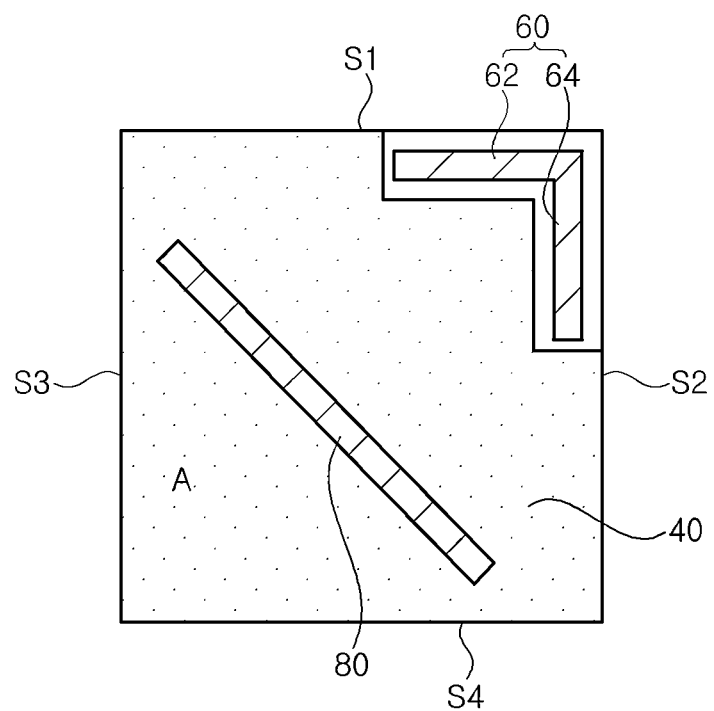

In FIG. 5, a p-type electrode pad 80 may be composed of a single linear portion. The p-type electrode pad 80 may include two ends disposed adjacent to two sides S3, S4 of the opposite corner with respect to an n-type electrode pad 60.

Although the p-type electrode pad 80 is composed of a single linear portion, the p-type electrode pad 80 may be defined to surround a peripheral region A of the opposite corner together with sides S3, S4 of the opposite corner. Further, since both ends of the p-type electrode pad 80 are adjacent to sides S3, S4 of the opposite corner, and the central region of the p-type electrode pad 80 is in proximity to the n-type electrode pad 60, the light emitting device of FIG. 5 also has improved luminous uniformity.

Figure 6:
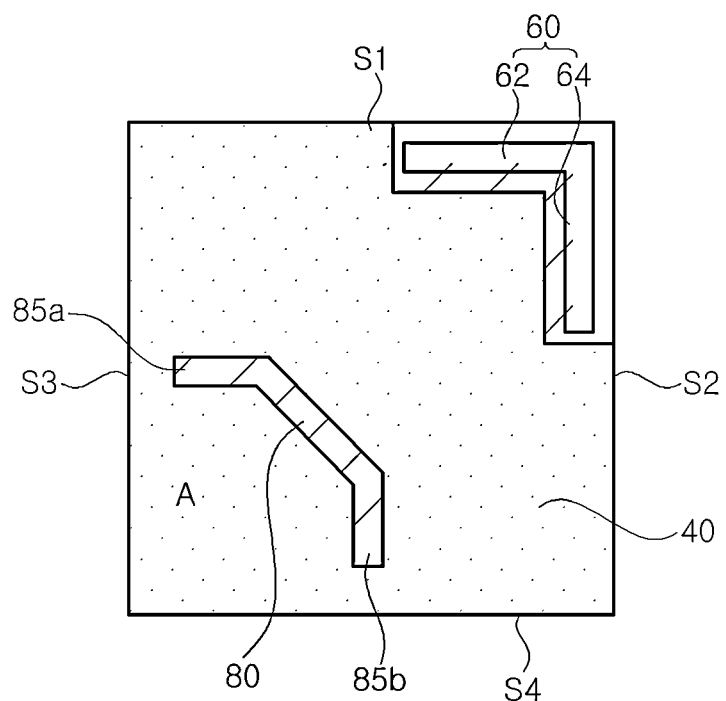

FIG. 6 shows a modification of the light emitting device shown in FIG. 5, wherein both ends of a linear portion of the p-type electrode pad 80 are bent to form extended arms 85a, 85b, which are closer to both sides S3, S4 of the opposite corner compared to the light emitting device of FIG. 5. Extended arms 85a, 85b may be perpendicularly oriented towards sides S3, S4. The extended arms 85a, 85b may form an obtuse angle with a central portion of the p-type electrode pad 80.

Figure 7:
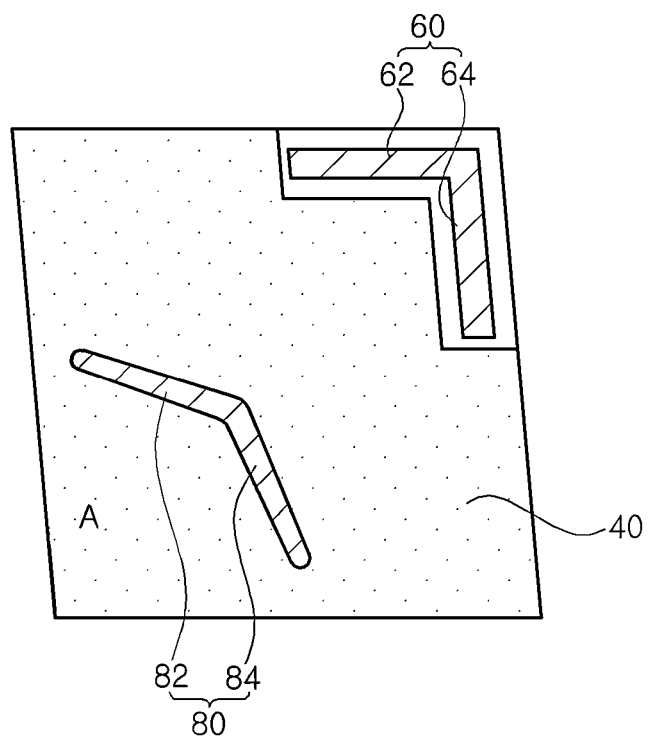

FIG. 7 shows a light emitting cell 40 having a parallelogram shape.

Figure 8:
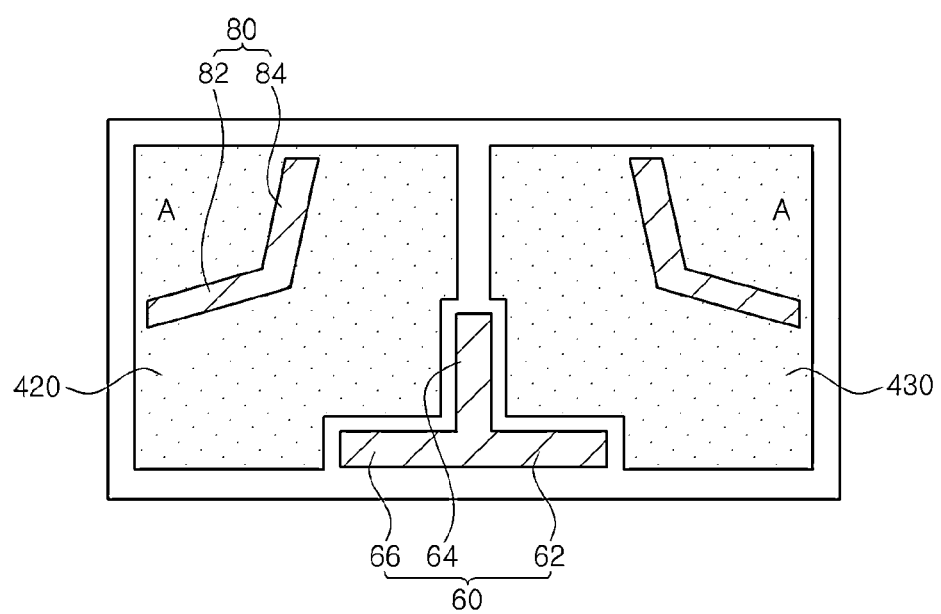

FIG. 8 shows two adjacent light emitting cells 420, 430 wherein a single n-type electrode pad 60 is commonly included in the two adjacent light emitting cells 420, 430. Referring to FIG. 8, one linear portion 64 of the n-type electrode pad 60 is commonly included in two adjacent light emitting cells 420, 430 and another linear portion 62 of the n-type electrode pad 60 in one light emitting cell 420 may be connected to the linear portion 66 of the n-type electrode pad 60 in the other light emitting cell 430 adjacent to the first light emitting cell 420 to form a straight line.

Figure 9:
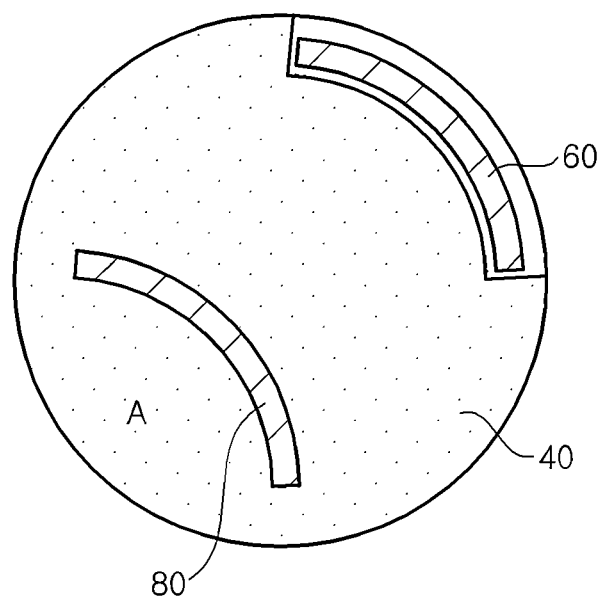

FIG. 9 shows a light emitting cell 40 having a circular shape In FIG. 9, a n-type electrode pad 60 may have an arc shape formed along a portion of the circumference of the light emitting cell 40, and a p-type electrode pad 80 may be formed on an upper surface of the light emitting cell 40 parallel to the n-type electrode pad 60 such that a peripheral region A of the light emitting cell 40 may be surrounded and defined by the p-type electrode pad 80 together with an arcuate boundary of the light emitting cell 40. Both ends of the p-type electrode pad 80 may be located near a boundary or circumference of the light emitting cell 40, and a central region of the p-type electrode pad 80 facing the n-type electrode pad 60 may be situated closer to the n-type electrode pad 60 than both ends of the p-type electrode pad 80. In some cases, a light emitting cell 40 may have an elliptical shape or any other suitable geometrical shapes including a curved line.

Figure 10:
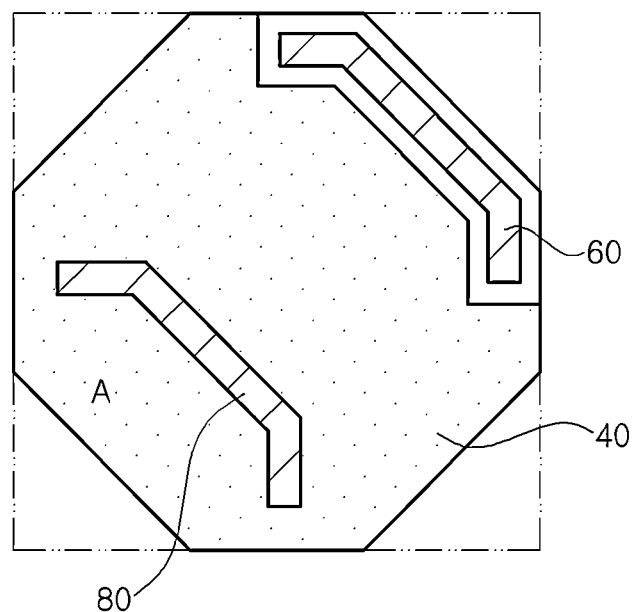

FIG. 10 shows a light emitting cell 40 having an octagonal shape. This light emitting cell 40 may be formed by removing regions indicated by dash-dot dotted lines from a quadrangular-shaped light emitting cell to form an octagon. Accordingly, the n-type electrode pad 60 is disposed at one corner of the octagonal light emitting cell 40. The n-type electrode pad 60 may have a shape corresponding to one corner of the light emitting cell 40. For example, two short linear portions may be connected to both ends of a single elongated linear portion at the center of the n-type electrode pad 60, and the p-type electrode pad 80 may have the same shape as that of the n-type electrode pad 60 and may be disposed parallel to the n-type electrode pad 60. The p-type electrode pad 80 may surround a peripheral region A of an opposite corner of the octagonal light emitting device 40 together with boundaries of the opposite corner. Both ends of the p-type electrode pad 80 may be orthogonal to and/or closer to the boundary of the light emitting cell 40 than the central region thereof.

Figure 11A:
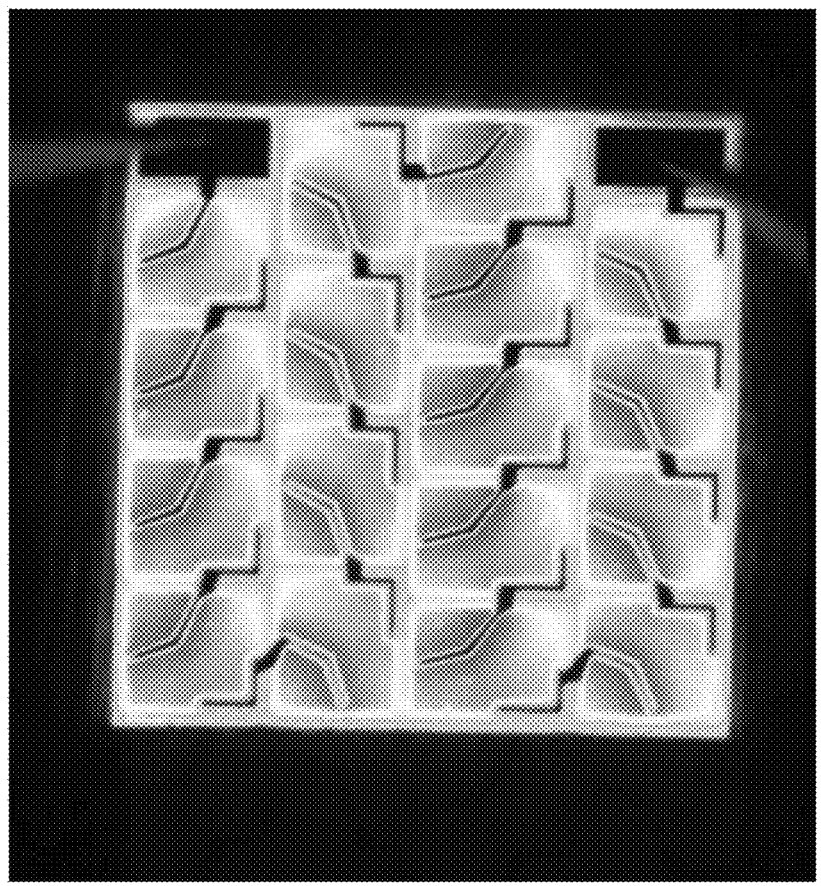
FIG. 11A and FIG. 11B are pictures showing test results of luminous uniformity of light emitting diodes of an Example and a Comparative Example, respectively, according to exemplary embodiments of the invention.
Figure 11B:
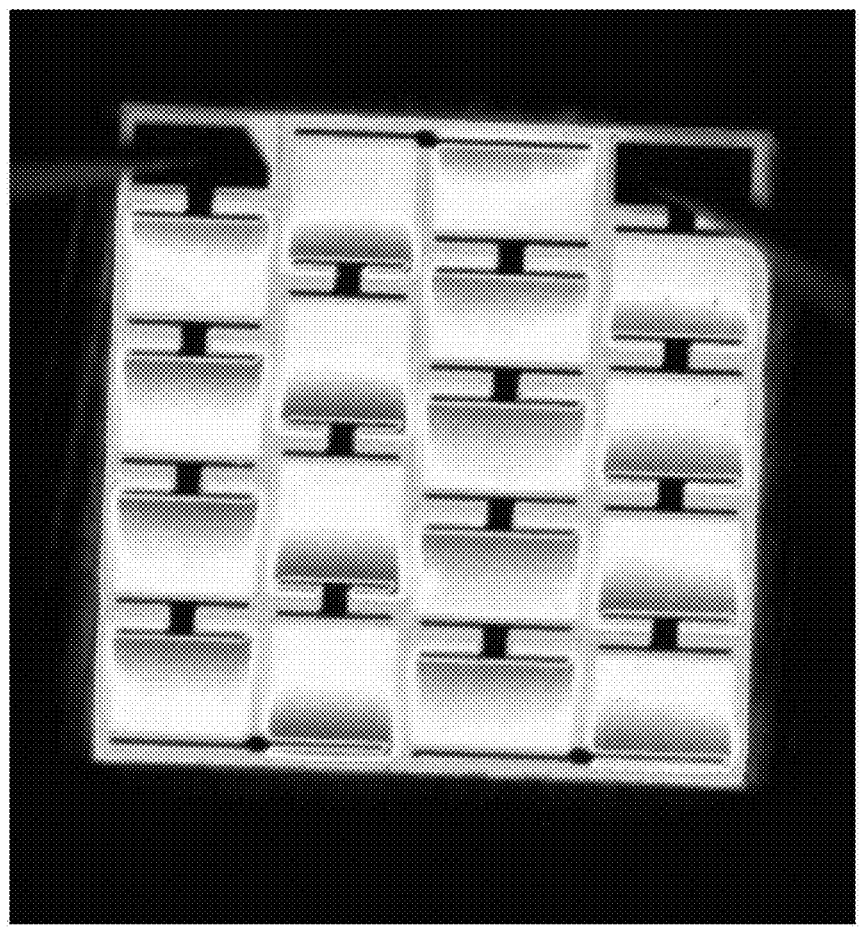

FIG. 11A and FIG. 11B are images showing luminosity test results of light emitting diodes. FIG. 11A is an example ("Example") of the luminosity test results of light emitting diodes according to exemplary embodiments of the invention, for example, according to the light emitting diodes of FIG. 2. FIG. 11b is an example ("Comparative Example") of the luminosity test results of light emitting diodes according to conventional light emitting diodes, for example, according to the light emitting diodes of FIG. 1. TABLE 1 shows electrical characteristics of the Example in FIG. 11A and the Comparative Example in FIG. 11B. The material for semiconductor layers of light emitting cells and the size of the light emitting cells in FIG. 11A and FIG. 11B are the same, but the arrangement of the electrode pads in FIG. 11A and FIG. 11B are different. Each of the light emitting cells may include an ITO layer having a thickness of 1200 angstroms (Å) formed at an upper side of each light emitting cell.

In the light emitting diode of Example shown in FIG. 11A, the light emitting cells have uniform brightness. On the contrary, in the light emitting diode of Comparative Example shown in FIG. 11B, there is a difference in brightness between a region near the p-type electrode pad and a region distant from the p-type electrode pad. Relatively dark regions in FIG. 11A and FIG. 11B emit less light than other regions.

As is evident from TABLE 1 below, the light emitting diode of Example in FIG. 11A has a better power efficiency than that of Comparative Example. Further, the light emitting diode of Example has a lower forward voltage, higher power, and higher power efficiency than that of Comparative Example.

TABLE 1

| | Forward voltage | | Power | | Wavelength | | Power efficiency WPE (%) |
| --- | --- | --- | --- | --- | --- | --- | --- |
| | Avg. [V] | Standard Deviation (Std) | Avg. [mW] | Std | Avg. [nm] | Std | |
| Comparative Example (FIG. 11B) | 56.92 | 2.70 | 362.87 | 19.19 | 454.25 | 0.89 | 31.88 |
| Example (FIG. 11A) | 56.58 | 1.23 | 382.00 | 12.08 | 453.71 | 1.54 | 33.76 |

Figure 12:
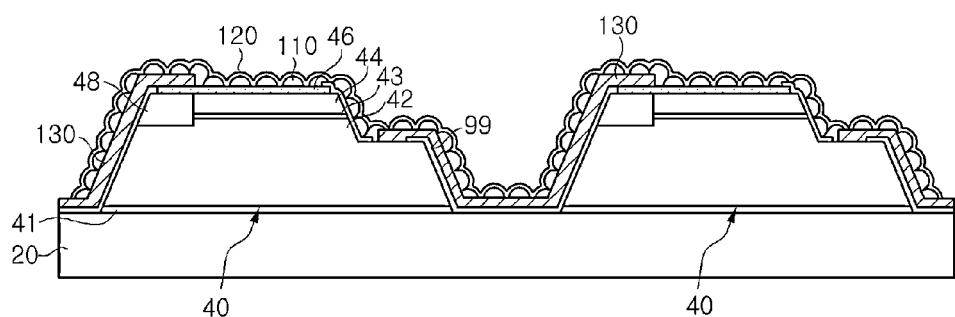
FIG. 12 is a cross-sectional view taken along line I-I of the light emitting diode in FIG. 2, according to the exemplary embodiments of the invention.

FIG. 12 is a cross-sectional view taken along line I-I of the light emitting diode 100 of FIG. 2, according to exemplary embodiments of the invention.

Referring to FIG. 12, the light emitting diode 100 may include a single substrate 20, and a plurality of light emitting cells 40 formed on the single substrate 20 as described above. Each of the light emitting cells 40 may include an n-type lower semiconductor layer 42, a p-type upper semiconductor layer 44 may be formed on at least a portion of the n-type lower semiconductor layer 42, and an active layer 43 interposed between the lower semiconductor layer 42 and the upper semiconductor layer 44. The lower semiconductor layer 42 may be disposed on the substrate 20 or, optionally, in some cases, on a buffer layer 41 disposed on the substrate 20. The light emitting diode 100 may include a transparent electrode layer 46 in each of the light emitting cells 40. The light emitting diode 100 may include an insulation layer 99, a wire layer 130, micro-lenses 110, and a protective insulation film 120. The wire layer 130 may be formed by a step-cover process and may integrally include the n-type electrode pad 60, the p-type electrode pad 80, and the wires 52, as shown in FIG. 2.

Referring to FIG. 12, the lower semiconductor layer 42, the active layer 43 and the upper semiconductor layer 44 may be formed of a gallium nitride-based semiconductor material, such as Boron (B), Aluminum (Al), Indium (In), or Gallium (Ga) nitride. The material and composition of the active layer 43 may be selected depending on a desired luminescence wavelength, for example, ultraviolet or blue light. The lower semiconductor layer 42 and the upper semiconductor layer 44 may be formed of a material having a higher band gap energy than a band gap energy of the active layer 43. The lower semiconductor layer 42 and/or the upper semiconductor layer 44 may have a single layer structure or a multiple-layer structure. Further, the active layer 43 may have a single quantum-well structure or a multi-quantum well structure.

In FIG. 12, the lower semiconductor layer 42 may have a stepped portion formed along a sidewall of the light emitting diode 100. A region of the light emitting cell 40 above the stepped portion of the lower semiconductor layer 42 may be defined as a mesa. The mesa sidewall may be inclined such that the mesa may have a width that gradually decreases away from the substrate 20. An inclined angle of the mesa sidewall with respect to an upper surface of the substrate 20 may be in the range of 15 to 80 degrees. A region of the lower semiconductor layer 42 under the mesa may also have a sidewall, which is inclined to have a width that gradually decreases away from the substrate 20. An inclined angle of the sidewall of the lower semiconductor layer 42 with respect to the upper surface of the substrate 20 may be in the range of 15 to 80 degrees.

This inclined configuration of the lower semiconductor layer 42 may assist in conformal deposition of other layers, for example, the insulation layer 99 and the wire layer 130, to be formed on the light emitting cells 40.

The inclined angle of the mesa sidewall may be the same as the inclined angle of the sidewall of the lower semiconductor layer 42 under the mesa sidewall. However, exemplary embodiments of the invention are not limited thereto, and these inclined angles may be adjusted to any different and suitable angle. For example, the inclined angle of the mesa sidewall may be smaller than the inclined angle of the sidewall of the lower semiconductor layer 42. As a result, light generated from the active layer 43 can be easily emitted through the mesa sidewall, thereby improving light extraction efficiency while ensuring a relatively wide region for the light emitting cells.

Each of the light emitting cells 40 may include a current shield 48 below at least a portion of the wire layer 130, particularly, below the p-type electrode pad 60. The current shield 48 may be provided to the lower semiconductor layer 42, the active layer 43 and/or upper semiconductor layer 44 of each of the light emitting cells 40. The current shield 48 may shield direct flow of electric current from the wire layer 130 formed on the upper semiconductor layer 44 to allow wide current spreading on the transparent electrode layer 46. The current shield 48 may be formed of an insulation material, for example, silicon dioxide ($SiO_2$,) aluminum oxide ($Al_2O_3$), silicon nitride ($Si_3N_4$), or titanium dioxide ($TiO_2$), and may be a distributed Bragg reflector (DBR), which may be formed by alternately stacking materials having different refractive indexes. The DBR may have a structure wherein a relatively low refractive index layer and a relatively high refractive index layer may repeatedly be stacked above each other. The relatively low refractive index layer may be formed of $SiO_2$ or $Al_2O_3$, and the relatively high refractive index layer may be formed of $Si_3N_4$ or $TiO_2$.

The buffer layer 41 may be employed to relieve lattice mismatch between the substrate 20 and the lower semiconductor layer 42. In particular, lattice mismatch may occur if the substrate 20 is a growth substrate, particularly, a sapphire substrate.

The transparent electrode layer 46 may be located on an upper surface of the upper semiconductor layer 44 and may have a smaller area than the upper semiconductor layer 44. The transparent electrode layer 46 may be recessed from an edge of the upper semiconductor layer 44. Accordingly, current crowding at the edge of the transparent electrode layer 46 through the sidewall of the light emitting cell 40 can be prevented.

The insulation layer 99 covers the light emitting cells 40. The insulation layer 99 may have openings formed on the lower semiconductor layers 42, and openings formed on the upper semiconductor layers 44 or the transparent electrode layer 46. The sidewalls of the light emitting cells 40 may be covered by the insulation layer 99. The insulation layer 99 may also cover the substrate 20 in regions between the light emitting cells 40. The insulation layer 99 may be formed of any suitable material, including, for example, silicon dioxide ($SiO_2$) or silicon nitride.

The wire layer 130 may be formed on the insulation layer 99. The wire layer 130 may be formed on the lower semiconductor layer 42, the upper semiconductor layer 44, the current shield 48, and/or the transparent electrode layer 46, in part, through the openings. The parts of the wire layer 130 formed on the lower semiconductor layer 42 and the upper semiconductor layer 44 through the openings may be the n-type electrode pad 60 and the p-type electrode pad 80, and parts of the wire layer 130 connecting the electrode pads of adjacent light emitting cells on the insulation layer 99 may be wires 52.

The wire layer 130 may be electrically connected to the upper semiconductor layer 44 via the transparent electrode layer 46. The wire layer 130 may electrically connect the lower semiconductor layers 42 of a light emitting cell 40 to the upper semiconductor layers 44 of adjacent light emitting cells to form a serial array of the light emitting cells 40. According to exemplary embodiments of the present invention, the light emitting diode 100 may have a plurality of serial arrays, which are connected in reverse parallel to each other and driven by an AC power source. A bridge rectifier (not shown) may be connected to the serial array of light emitting cells to allow the light emitting cells to be driven by an AC power source. The bridge rectifier may be formed by connecting light emitting cells, which have the same configuration as that of the light emitting cells 40, via a wire layer or wires. The wire layer or wires may be formed of any suitable conductive material, a doped semiconductor material (e.g., poly-crystalline silicon), or metal.

Micro-lenses 110 may be formed on the wire layer 130 and the insulation layer 99. The micro-lenses 110 may have a semi-spherical convex surface to act as convex lenses. The micro-lenses 110 may have a micrometer scale horizontal diameter of, for example, 9 micrometers (μm). The micro-lenses 110 may be formed of a material having a lower index of refraction than the transparent electrode layer 46. For example, the micro-lenses 110 may be formed of a polymer. Examples of the polymer include polyimide (PI), epoxy resin (SU-8), spin-on-glass (SOG) poly methylmethacrylate (PMMA), poly dimethylsioxane (PDMS), poly carbonate (PC), silicone gel, and resin. The refractive index and/or indexes of the transparent electrode layer 46 and/or micro-lenses 110 may vary depending on the refractive index of a material adjacent to the electrode layer 46 and/or the micro-lenses 110. For example, if a gallium nitride semiconductor layer having a refractive index of 2.45 is used as the upper semiconductor layer 44, an ITO layer having a refractive index of 2.04 may be used as the transparent electrode layer 46. Further, if an SiO$_2$ layer having a refractive index of 1.54 is used as the protective insulation layer 120, the micro-lenses 110 may have a refractive index in the range of 1.67~1.8, which is a refractive index between the refractive indices of the transparent electrode layer 46 and the protective insulation layer 120. Accordingly, the micro-lenses may have insulating properties. However, in some cases, the micro-lenses may be conductive.

The protective insulation layer 120 may be formed to cover the micro-lenses 110. The protective insulation layer 120 may prevent the micro-lenses 110 and the wire layer 130 from being contaminated for example, by moisture, and prevents the wire layer 130 from being damaged by external force. The protective insulation layer 120 may be formed of a light-transmitting material, such as, for example, silicon oxide film (SiO$_2$) or silicon nitride film.

FIG. 13, FIG. 14, FIG. 15, and FIG. 16 are sectional views illustrating a method of manufacturing a light emitting diode, as shown in FIG. 12.

Figure 13:
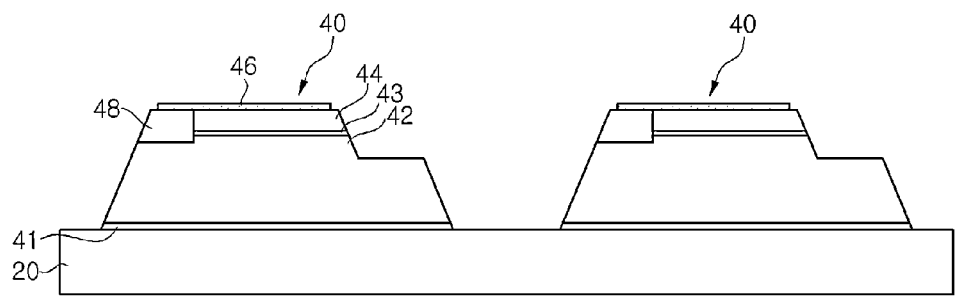
FIG. 13, FIG. 14, FIG. 15, and FIG. 16 are sectional views illustrating a method of manufacturing the light emitting diode of FIG. 12, according to exemplary embodiments of the invention.

Referring to FIG. 13, a lower semiconductor layer 42, an active layer 43, and an upper semiconductor layer 44 may be formed on a substrate 20. A buffer layer 41 may be formed on the substrate 20 before forming the lower semiconductor layer 42.

The substrate 20 may be a sapphire (Al$_2$O$_3$), silicon carbide (SiC), zinc oxide (ZnO), silicon (Si), gallium arsenic (GaAs), gallium phosphorous (GaP), lithium-alumina (LiAl$_2$O$_3$), boron nitride (BN), aluminum nitride (AlN) or gallium nitride (GaN) substrate, or any suitable material. The substrate 20 may be selected from various materials depending on the material forming the semiconductor layers 42, 43, 44.

The buffer layer 41 may be formed to relieve lattice mismatch between the substrate 20 and the lower semiconductor layer 42. For example, the buffer layer 41 may be formed of gallium nitride (GaN) or aluminum nitride (AlN). If the substrate 20 is a conductive substrate, the buffer layer 41 may be an insulation layer or a semi-insulation layer. For example, the buffer layer 41 may be formed of AlN or semi-insulated GaN.

The lower semiconductor layer 42, the active layer 43, and the upper semiconductor layer 44 may be formed of a GaN-based compound semiconductor material, such as, for example B, Al, In, or Ga nitride. The lower and upper semiconductor layers 42, 44, and the active layer 43 may be intermittently or continuously formed by metal organic chemical vapor deposition (MOCVD), molecular beam epitaxy or hydride vapor phase epitaxy (HVPE).

The upper and lower semiconductor layers 42, 44 may be n-type and p-type semiconductor layers or vice versa, respectively. The n-type semiconductor layer may be formed by doping an n-type impurity, for example silicon (Si), into a GaN-based compound semiconductor layer, and the p-type semiconductor layer may be formed by doping a p-type impurity, for example magnesium (Mg), into the GaN-based compound semiconductor layer.

A current shield 48 may be formed on a portion of the upper semiconductor layer 44 below the wire layer 130, for example, below the p-type electrode pad 80 (see FIG. 2). In some cases, the current shield 48 may be formed on a region of the lower semiconductor layer 42, the active layer 43, and/or the upper semiconductor layer 44. The current shield 48 may be formed of an insulation material, for example, SiO$_2$, Al$_2$O$_3$, Si$_3$N$_4$ or TiO$_2$, and may be a distributed Bragg reflector (DBR), which may be formed by alternately stacking materials having different indexes of refraction one above another.

A transparent electrode layer 46 may be formed on the current shield 48 and the upper semiconductor layer 44. The transparent electrode layer 46 may be formed of any suitable conductive oxide, such as, for example, indium tin oxide (ITO). Some of the transparent electrode layer 46, the upper semiconductor layer 44, the active layer 43, and the lower semiconductor layer 42 may be etched using a photoresist pattern (not shown) as an etching mask. As a result, the shape of the photoresist pattern may be transferred to the semiconductor layers 42, 43, 44 to form mesas with inclined sidewalls.

While the photoresist pattern remains on the mesas, the transparent electrode layer 46 may be recessed by wet etching. The transparent electrode layer 46 may be recessed from an edge of the upper semiconductor layer 44 on the mesa using an etchant by regulating etching time followed by removal of the photoresist pattern.

The lower semiconductor layer 42 may be etched to form divided light emitting cells 40 using a photoresist pattern (not shown), which may cover the plurality of mesas while defining light emitting cell regions, as an etching mask. The buffer layer 41 may also be etched to expose an upper surface of the substrate 20.

While etching the lower semiconductor layer 42 through the photoresist pattern, the mesas may be covered by the photoresist pattern. Accordingly, the mesas may be prevented from being damaged during an isolation process. Further, a stepped portion may be formed on the lower semiconductor layer 42, as shown in the figures, by the isolation process. Then, the photoresist pattern may be removed.

Figure 14:
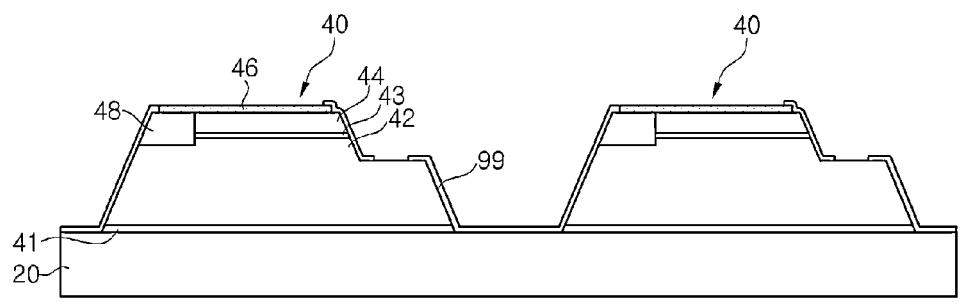

Referring to FIG. 14, a continuous insulation layer 99 may be formed on the light emitting cells 40. The insulation layer 99 may cover sidewalls and upper surfaces of the light emitting cells 40 and the upper surface of the substrate 20 in a region between the light emitting cells 40. The insulation layer 99 may be formed of silicon oxide or silicon nitride by chemical vapor deposition (CVD).

Since the sidewalls of the light emitting cells 40 are inclined and the lower semiconductor layer 42 is formed with the stepped portion, the insulation layer 99 may easily cover the sidewalls of the light emitting cells 40.

The insulation layer 99 may be patterned by photolithography and etching to have openings, which may expose the lower semiconductor layers 42, and openings, which expose the transparent electrode layer 46. The openings further may expose the upper semiconductor layers 44.

Figure 15:
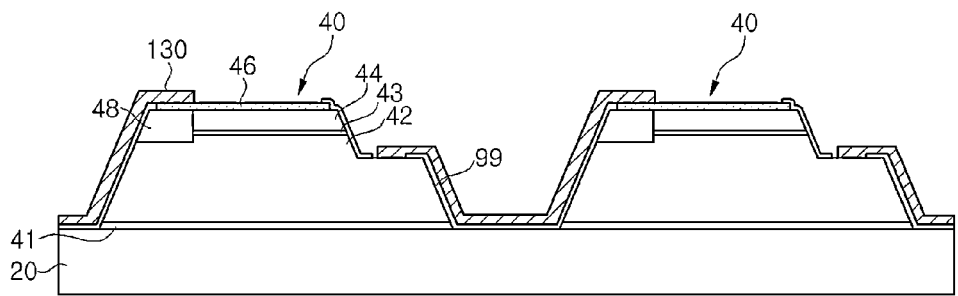

Referring to FIG. 15, a wire layer 130 may be formed on the insulation layer 99 having the openings. Part of the wire layer 130 may be electrically connected to the lower semiconductor layers 42 and the upper semiconductor layers 44 through the openings, such that the lower semiconductor layers 42 of adjacent light emitting cells may be electrically connected to the upper semiconductor layers 44 of a light emitting cell 40 through the wire layer 130.

The wire layer 130 may be formed by plating or vapor deposition such as electron beam deposition. Since the stepped portion may be formed on the sidewall of each of the light emitting cells 40 (e.g., on the sidewall of the lower semiconductor layer 42), the wire layer 130 may be stably formed on the sidewall of the light emitting cell 40, thus preventing disconnection and/or short circuit of wires. The light emitting cells 40 may be wired to each other on the substrate by the wire layer 130.

Figure 16:
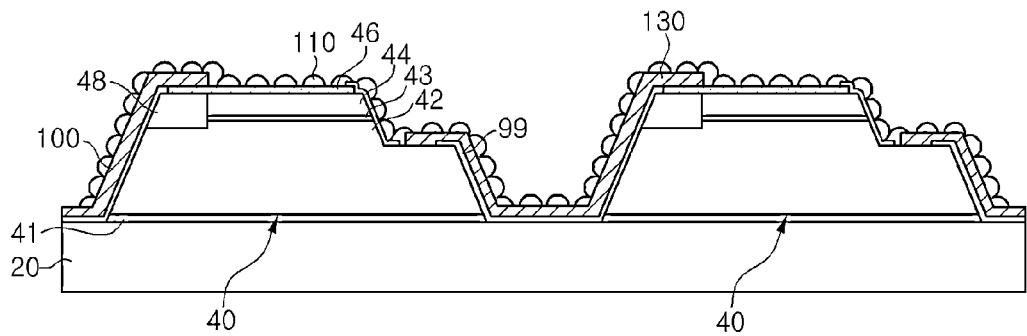

Referring to FIG. 16, the micro-lenses 110 may be formed on the light emitting cells 40. The micro-lenses 110 may be formed by wet etching after a polymer layer is formed on the wire layer 130 on the substrate 20. The micro-lenses 110 may cover the mesa sidewall and some regions of the lower semiconductor layer 42 exposed by mesa etching. In some cases, after the polymer layer is formed, a photoresist pattern (not shown) may be formed into a lens shape by a reflow technique and the polymer layer may then be subjected to dry etching using the photoresist pattern as an etching mask to form the micro-lenses 110.

FIG. 17 shows plan views of various micro-lenses according to exemplary embodiments of the present invention.

As shown in FIG. 17(*a*), the micro-lenses 110 may have a circular or elliptical shape in plan view. For example, the horizontal cross-section of a micro-lens 110 may be in a circular or elliptical shape. However, the horizontal cross-section of the micro-lens 110 may not be limited to a circular or elliptical shape, and may have any suitable shape including, for example, a hexagonal shape, a triangular shape or a quadrangle shape, as shown in FIG. 17(*b*) and FIG. 17(*c*). When the horizontal cross-section of the micro-lens has a hexagonal shape or a triangular shape, the micro-lenses 110 may be disposed in a more dense arrangement.

The shapes of the micro-lenses 110 may be any suitable combination of horizontal cross-sectional shapes and vertical cross-sectional shapes and may be selected based on various factors such as, fabrication and light extraction efficiency. For example, when the micro-lenses 110 have a vertical cross-section of a triangular shape as shown in FIG. 17(*c*) and a horizontal cross-section of a triangular shape as shown in FIG. 17(*c*), the micro-lenses 110 may have a tetrahedral shape. As a result, light entering the micro-lenses 110 may easily be emitted externally.

Figure 18:
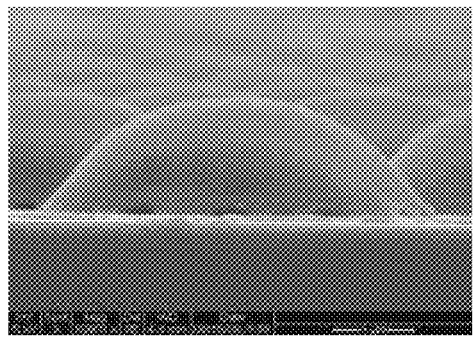
FIG. 18 and FIG. 19 are pictures of various micro-lenses according to exemplary embodiments of the invention.
Figure 19:
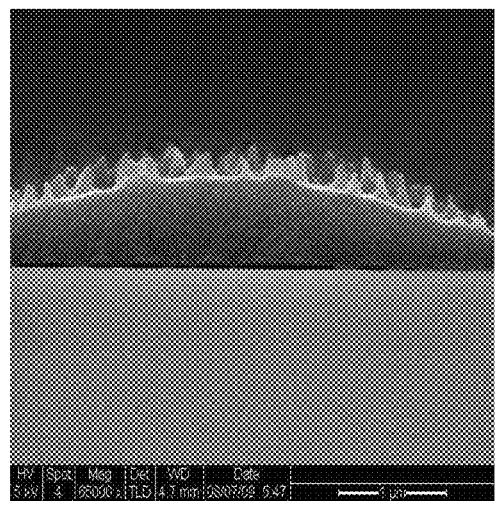

In addition, the micro-lens 110 may have a smooth surface as shown in FIG. 18, or may have an uneven surface as shown in FIG. 19.

In FIG. 12, when micro-lenses 110 having various shapes are disposed on the transparent electrode layer 46 and the mesa sidewalls, light generated in the active layer 43 can be emitted through the micro-lenses 110, thereby improving light extraction efficiency.

A protective insulation film 120 may be formed on the micro-lenses 110 The protective insulation film 120 may be formed of a light-transmitting material, for example, silicon oxide or silicon nitride, by chemical vapor deposition.

The light emitting diode 100 according to the exemplary embodiments of the invention has significantly improved luminous uniformity and power efficiency through improved current spreading characteristics between a first electrode pad and a second electrode pad in a light emitting cell. Particularly, a light emitting diode including a plurality of light emitting cells on a single substrate, such as an AC light emitting diode, allows the light emitting cells to emit uniform light and has significantly improved power efficiency.

Although the invention has been illustrated with reference to some exemplary embodiments in conjunction with the drawings, it will be apparent to those skilled in the art that various modifications and changes can be made in the invention without departing from the spirit and scope of the invention. Therefore, it should be understood that the embodiments are provided by way of illustration only and are given to provide complete disclosure of the invention and to provide thorough understanding of the invention to those skilled in the art. Thus, it is intended that the invention covers the modifications and variations of this invention provided they come within the scope of the appended claims and their equivalents.

What is claimed is:

1. A light emitting diode, comprising:
a substrate;
a plurality of light emitting cells separated from each other on the substrate, and each light emitting cell comprising a lower semiconductor layer, an active layer disposed on at least a portion of the lower semiconductor layer, an upper semiconductor layer, and a transparent electrode layer;
a wire layer to electrically connect a lower semiconductor layer of a first light emitting cell to an upper semiconductor layer of a second light emitting cell adjacent to the first light emitting cell;
an insulation layer disposed between the wire layer and the plurality of light emitting cells to prevent short circuit in the plurality of light emitting cells due to the wire layer; and
micro-lenses formed on outside surfaces of the plurality of light emitting cells an on an upper surface of the substrate between the first light emitting cell and the second light emitting cell, the micro-lenses each comprising a horizontal diameter less than a diameter of each light emitting cell, wherein:
at least two of the micro-lenses are disposed above each light emitting cell in a vertical direction, and the micro-lenses are formed along the outside surfaces of the plurality of light emitting cells.

2. The light emitting diode of claim 1, further comprising:
a protective insulation layer disposed on the micro-lenses.

3. The light emitting diode of claim 2, wherein the micro-lenses comprise a material having an intermediate index of refraction between a refractive index of the transparent electrode layer and a refractive index of the protective insulation layer.

4. The light emitting diode of claim 1, wherein the micro-lenses comprise a polymer.

5. The light emitting diode of claim 1, wherein:
the upper semiconductor layer comprises a gallium nitride-based semiconductor layer;
the transparent electrode layer comprises an indium tin oxide (ITO) layer;
the micro-lenses comprise a polymer; and
the protective insulation film comprises silicon dioxide ($SiO_2$).

6. The light emitting diode of claim 1, wherein the micro-lenses comprise a vertical cross-section, and a width of the vertical cross-section narrows further away from the substrate.

7. The light emitting diode of claim 1, wherein each of the light emitting cells comprise a first region at a boundary of the light emitting cell and a second region opposite to the first region, a first electrode pad is disposed as a part of the wire layer at the first region, and a second electrode pad is disposed in a linear shape as a part of the wire layer to face the first electrode pad while regionally defining a peripheral region together with a boundary of the second region.

8. The light emitting diode of claim 1, wherein each of the light emitting cells comprises a current shield under the wire layer.

9. A light emitting diode, comprising:
a substrate;
a plurality of light emitting cells separated from each other on the substrate and each light emitting cell comprising a lower semiconductor layer, an active layer disposed on at least a portion of the lower semiconductor layer, an upper semiconductor layer, and a transparent electrode layer;

a wire layer to electrically connect a lower semiconductor layer of a first light emitting cell to an upper semiconductor layer of a second light emitting cell adjacent to the first light emitting cell; and an insulation layer disposed between the wire layer and the plurality of light emitting cells to prevent short circuit in the plurality of light emitting cells due to the wire layer, wherein each of the light emitting cells comprises a current shield under the wire layer, and micro-lenses are formed on outside surfaces of the light emitting cells and on an upper surface of the substrate between the first light emitting cell and the second light emitting cell, the micro-lenses each comprising a horizontal diameter less than a diameter of each light emitting cell, wherein at least two of the micro-lenses are disposed above each light emitting cell in a vertical direction, and the micro-lenses are formed along the outside surfaces of the plurality of light emitting cells.

10. The light emitting diode of claim 9, wherein the wire layer integrally comprises a first electrode pad disposed on the lower semiconductor layer and a second electrode pad disposed on the transparent electrode layer or the upper semiconductor layer, and the current shield is disposed below the second electrode pad.

11. The light emitting diode of claim 10, wherein each of the light emitting cells comprises a first region at a boundary of the light emitting cell and a second region opposite to the first region, a first electrode pad is disposed as a part of the wire layer at the first region of the light emitting cell, and a second electrode pad is disposed in a linear shape as a part of the wire layer to face the first electrode pad while regionally defining a peripheral region together with a boundary of the second region.

12. The light emitting diode of claim 9, wherein the current shield comprises at least one material selected from silicon dioxide ($SiO_2$), aluminum oxide ($Al_2O_3$), silicon nitride ($Si_3N_4$), and titanium dioxide ($TiO_2$).

13. The light emitting diode of claim 12, wherein the current shield comprises a distributed Bragg reflector (DBR).

14. The light emitting diode of claim 9, wherein:
the current shield comprises a distributed Bragg reflector (DBR) comprising a low refractive index layer and a high refractive index layer alternately stacked above each other;
the low refractive index layer comprises silicon dioxide ($SiO_2$) or aluminum oxide ($Al_2O_3$); and
the high refractive index layer comprises silicon nitride ($Si_3N_4$) or titanium dioxide ($TiO_2$).

15. The light emitting diode of claim 1, wherein a refractive index of the transparent electrode layer is greater than a refractive index of the micro-lenses and less than a refractive index of the upper semiconductor layer.

16. The light emitting diode of claim 15, wherein the micro-lenses comprise a horizontal diameter about 9 μm.

17. The light emitting diode of claim 9, wherein a refractive index of the transparent electrode layer is greater than a refractive index of the micro-lenses and less than a refractive index of the upper semiconductor layer.

18. The light emitting diode of claim 17, wherein the micro-lenses comprise a horizontal diameter about 9 μm.

* * * * *